United States Patent [19]

Warner et al.

[11] 4,456,880

[45] Jun. 26, 1984

[54] I-V CURVE TRACER EMPLOYING PARAMETRIC SAMPLING

[76] Inventors: Thomas H. Warner, 25 Tollen St., Boston, Mass. 02116; Charles H. Cox, III, 31 Berry Corner Rd., Carlisle, Mass. 01741

[21] Appl. No.: 402,040

[22] Filed: Jul. 26, 1982

Related U.S. Application Data

[63] Continuation-in-part of Ser. No. 345,682, Feb. 4, 1982, abandoned.

[51] Int. Cl.³ .............................................. G01R 31/22
[52] U.S. Cl. .............................. 324/158 D; 324/158 R; 324/158 T
[58] Field of Search ............ 324/158 D, 158 R, 158 T, 324/60 C; 136/290

[56] References Cited

U.S. PATENT DOCUMENTS

| | | | |
|---|---|---|---|
| 2,894,313 | 7/1959 | Stineman, Jr. et al. | 324/158 D |
| 3,264,563 | 8/1966 | Arnold | 324/158 D |
| 4,080,571 | 3/1978 | Weisbrod | 324/158 D |
| 4,129,823 | 12/1978 | van der Pool et al. | 324/158 D |
| 4,163,194 | 7/1979 | Ross | 324/158 D |
| 4,184,111 | 1/1980 | Turner et al. | 324/158 D |

OTHER PUBLICATIONS

Cull et al., The DOE/LeRC Photovoltaic Systems Test Facility; NASA, Lewis Research Center, Cleveland, Ohio 44135; 1978.

Cull et al., High Speed Computerized Data Acquisition of Photovoltaic V-I Characteristics; NASA, Lewis Research Center, Cleveland, Ohio, 7-27-1981.

Primary Examiner—Ernest F. Karlsen
Attorney, Agent, or Firm—Cesari & McKenna

[57] ABSTRACT

An I-V curve tracer measures an I-V relationship of an electrical device during transient conditions. In operation, the curve tracer couples across the device a fixed-value inductive or capacitive load. While the current and voltage flowing through the device approach steady-state levels, the voltage and current are sampled and stored in a memory upon predetermined incremental changes in one parameter of the device such as voltage. A digital representation of one parameter, such as voltage, constitutes a memory address and another parameter, such as current, is stored at that address in the memory. A data processor subsequently retrieves the memory data and addresses to display or plot the I-V relationship of the device. This parametric sampling technique assures that the measurements are coincident in occurrence with the sweeping of the I-V curve and eliminates the need for complex control and timing circuits.

23 Claims, 13 Drawing Figures

I-V CURVE TRACER EMPLOYING PARAMETRIC SAMPLING

RELATED APPLICATION

This application is a continuation-in-part of our earlier application Ser. No. 345,682 filed on Feb. 4, 1982 under the same title now abandoned.

BACKGROUND OF THE INVENTION

This invention relates to test equipment for measuring the performance of electrical and electronic devices, and more specifically to current-voltage, or I-V curve tracers. An illustrative embodiment described herein is particularly suited to measure the I-V relationship of high-power photovoltaic arrays.

Curve tracers are useful for designing, diagnosing, monitoring, testing or measuring the performance of electrical devices, such as diodes, transistors, batteries, electrical circuits, and the like. Such curve tracers depict a relationship typically between a current, I, and a voltage, V, of the device or component being monitored under various load or power conditions. Relationships between parameters other than voltage and current may also be depicted (e.g. between two currents, or between a voltage and a power or, between other functions of voltage and current); herein the term "I-V" will be understood not to be limited to voltage and current relationships, but to include relationships between or among various other parameters as well. The information derived from these I-V curves is useful in characterizing the operation of the device, and in some instances determining whether an abnormal or faulty condition exists.

The device being tested may be active or passive; that is, it may generate energy or dissipate energy. If the device is active and generates energy, the curve tracer must in turn receive the energy produced by the device during the test, in which case the curve tracer typically includes an energy sink for receiving, storing and/or dissipating the energy. On the other hand, if the device is passive and dissipates energy, the curve tracer typically includes means for generating and supplying energy to the device to enable its I-V relationship to be measured. For both active and passive devices, however, measurements of the current and the voltage are made at various load levels of the device under test.

Photovoltaic solar cells, e.g. diodes, are active devices that generate energy. Their popularity has grown in recent years due to a recognized need to develop alternative energy sources. As a result, there now is a need for a general purpose portable test instrument for monitoring in the field a wide variety of photovoltaic solar cell arrays, and for diagnosing faults should such arrays become wholly or partly inoperative. Examples of inoperative conditions include degradation of the semiconductor material from which the solar cells are fabricated and reduction of the transmissivity of the protective transparent coating that covers the cells. Comparative analysis of the shapes of I-V curves taken at different times can reveal such changed conditions including the extent and nature of the faults.

In a photovoltaic array, the I-V curve is conventionally generated by connecting the output terminals of the array to the input terminals of a load. In general, an I-V curve can be swept out by changing some parameter of the load and recording the resulting voltage across the array and the current flowing through the array (i.e. the voltage and current at the array/load interconnection point).

If the load is an adjustable voltage sink, an I-V curve can be measured by sweeping the load voltage as a function of time while recording the resulting current; this is illustrative of conventional approaches for determining I-V curves, which are based on what can be called "forced sweep". In such forced sweep systems, the load is changed independently of the voltage and current at the point of interconnection between array and load.

Forced sweep is contrasted with "feedback sweep" in which the sweeping action of the load is controlled completely and exclusively as a function of the voltage and current at the array/load interconnection point.

An important subclass of feedback sweep is "natural sweep". Once initiated, the time course of a natural sweep depends solely on properties of the device under test (e.g. the array) and on properties of the load. With natural sweep, the "control" of the load is implicit in the load component itself. For example, in a test using a capacitive load, the energy storage capability of the load capacitor results in effectively changing the load. This is contrasted with a test using a resistive load, in which control circuits are used to vary the load.

A system using natural sweep can be much simpler than one using forced sweep. Forced sweep requires a variable load device and control circuitry to force the load to vary according to some external control or as a specified function of time. With natural sweep, a fixed value load device may be used, and sweep control circuitry to force the load to vary is entirely unnecessary.

In choosing an approach to determining I-V curves, particularly when high power levels are involved, it is also important to decide whether the emphasis will be on the curve shape as a whole or on continuously monitoring one point of the I-V curve. To continuously monitor one point requires that the curve tracer be able to continuously handle, i.e. either as a source or as a sink, the power of the chosen point in the I-V curve. Depending on the application, the resulting power could be ones, tens or even hundreds of thousands of watts. Handling this power requires large heat sinks and cooling fans. On the other hand, if determining curve shape is the principle concern, it is possible to make a transient measurement. By sweeping rapidly through the I-V curve, thereby spending only a short amount of time at each point, the power handling requirements can be drastically reduced. The reduction factor is approximately the time from one measurement to the next over the duration of a measurement. If, for example, it takes 0.01 seconds to sweep through a curve and one waits only 10 seconds between curves, the average power is reduced by a factor of 1000 over that required by the continuous monitoring approach. Thus implementing the transient sweeping approach avoids the need for large heat sinks and cooling fans.

As will be seen below, there are advantages to combining natural sweeping with the transient measurement approach, particularly for photovoltaic arrays. For photovoltaic arrays, a reactive load, such as a capacitor or inductor, provides the basis for achieving both of these objectives in a simple manner. With a capacitive load the sweep of the I-V curve begins at short circuit current and proceeds to open circuit voltage. An inductive load causes a sweep in the opposite direction, i.e. the curve starts at open circuit voltage and proceeds to short circuit current. A further advantage of the capacitive load is that it is easier to switch it onto and off of the array.

In natural sweep systems, generally neither current nor voltage are linear functions of time. Moreover, for a fixed quantity of load impedance, the total sweep time depends upon the magnitude of the open-circuit voltage and the short-circuit current of the array. Thus, in order to produce an I-V curve having a good distribution of sample points along the curve, the amount of load impedance should be selected so that the total sweep time is large enough to permit a sufficient number of samples to be taken, and control circuitry should be employed to assure that samples are taken at evenly distributed points along the I-V curve.

One prior system that uses a capacitive load in measuring the current-voltage relationship of a photovoltaic array was reported by Ronald C. Cull et al. in connection with work on a solar energy project sponsored by the U.S. Department of Energy at the NASA/Lewis Research Center in Cleveland, Ohio. They describe the system in an IEEE paper entitled "The DOE/LeRC Photovoltaic Systems Test Facility" published 1978. In the NASA/Lewis system, before conducting the test, steady-state short-circuit current flows through a shunt switch connected across the array in parallel with a capacitive load. To start sweeping, the shunt switch is opened; the capacitor charges, approaching open-circuit voltage; and the array current diminishes, approaching zero as the capacitor charges. After opening of the shunt switch, a predetermined number of measurements of the current through and voltage across the array are taken at fixed time intervals. An auxilliary current source may also be employed to charge the capacitor simultaneous with the array, and further to continue to charge the capacitor above the open-circuit voltage of the array.

According to a draft report obtained July 27, 1981 entitled "High-Speed Computerized Data Acquisition of Photovoltaic V-I Characteristics" by Cull et al., to provide different sweep times for different magnitudes of array voltages, the NASA/Lewis system makes use of a relatively large number of parallel connected capacitors, about 66,760 microfarads in total capacitance, and a plurality of switches and conductors to couple across the array a certain amount of capacitance. It is necessary in the NASA/Lewis system to finely adjust the value of the capacitive load in order to obtain satisfactory I-V curve measurements. Accordingly the amount of capacitance used for the sweep is switched into the system in incremental steps of 50 microfarads and the system's circuit arrangement is loaded with bulky and expensive switches and conductors to attain the desired capacitance. The system is thus not very suitable to be conveniently carried by hand to typically remote locations of photovoltaic arrays. Additionally, the NASA/Lewis system momentarily closes a shunt switch across the array to force it to short-circuit conditions. In the event that the shunt switch is closed inadvertently with charge on the capacitor, the shunt switch is destroyed due to the current surge from the capacitor, presenting a hazard to operating personnel.

Furthermore, the NASA/Lewis system does not provide any means for assuring that the voltage and current measurements at the output terminals of the device under test coincide with the occurrence and rate of natural sweeping so as to produce a sufficient number and even distribution of sample points along an I-V curve for a variety of electrical devices. We define this assurance as "capturing" the measurements in transit.

Another prior photovoltaic I-V curve tracer is described in U.S. Pat. No. 4,129,823. The system described uses a forced rather than natural sweep, and samples are taken at equal increments of time. This system varies the value of a resistive load as a nonlinear function of time; thus the samples which are taken at equal increments of time are distributed more evenly on the I-V curve than they would be if the value of the resistive load was varied linearly with time. The nonlinear characteristic of a field effect transistor is used to change the array load resistance in very fine steps at the low resistance region of the sweep, and in large steps at the higher resistance region of the sweep.

Other known curve tracers using forced sweep are described in U.S. Pat. No. 4,184,111 which employs a resistive load and a variable voltage source, and in U.S. Pat. No. 4,163,194 which varys a resistive load such that the voltage across the array either increases linearly with time or varys in response to a user control.

OBJECTS OF THE INVENTION

In view of the foregoing, an object of this invention is to provide an I-V curve tracer that employs simple sweep generation (e.g. natural sweep) and yet still captures the measurements made over the full course of a sweep.

Another object of the invention is to provide an I-V curve tracer which employs parametric sampling, that is, which while sweeping an I-V curve measures, or samples, voltage and current at controlled instances of time determined by the magnitude of a parameter of the device being tested, such as voltage, current, power or some other function of voltage and/or current.

A further object of the invention is to provide an I-V curve tracer capable of sampling voltage and current levels along selected portions of, and/or beginning at selected points on, the I-V curve in selected quadrants of a plot of the I-V relationship, and further capable of controlling the density of sample points along all or portions of the I-V curve.

Another object of this invention is to provide a curve tracer that permits the use of a single fixed value load impedance for a wide range of device voltages and current.

Another object of this invention is to provide a portable, light-weight I-V curve tracer that is suitable for use in the field or laboratory for measuring the performance of a photovoltaic array, individual cells in the array or other such electrical devices.

Yet another object of the invention is to provide a curve tracer that operates safely by performing the function of initial shunting by a capacitor, instead of by a switch, thus eliminating the use of any shunt switch across the device under test.

SUMMARY OF THE INVENTION

In accordance with an embodiment of this invention, a portable I-V curve tracer uses a reactive load, i.e., a capacitor or inductor, in measuring the I-V curve of a device under test (DUT). The curve tracer includes a data acquisition unit which includes voltage and current sensors for connection with the DUT, as well as a memory for storing sampled voltage and current levels. When the tracer is connected to the DUT, a series switch in the tracer is used to interconnect the load and the DUT so that no current flows before the switch is closed and sweeping begins. To obtain the I-V measurements, the series switch is closed and then the data acquisition unit samples the current and voltage. The sampling is triggered by predetermined incremental changes in one parameter of the electrical device such as current, voltage, power or some other function of current and/or voltage. Sampling on equal voltage increments is preferred. Thus it is not necessary to force the sweep to take a particular time course, as is necessary with systems taking samples at equal increments of time. Further, the data acquisition unit is assured of capturing the measurements at points distributed along the entire I-V curve, regardless of the total sweep time afforded by the reactive load in relation to the magnitude of the open-circuit voltage and the short-circuit current of the DUT. The measured current and voltage levels are digitized by respective analog-to-digital converters. A digital representation of the sample trigger parameter (e.g. voltage) may be used as the address at which the other measured parameter value (e.g. current) is stored. This arrangement substantially simplifies the electrical circuitry for storing the data and reduces by one half the amount of memory required.

An x-y plot of the I-V curve can be generated from the stored samples in the memory and displayed or plotted on a viewing medium. After completion of the sweep, the load is de-energized and readied for another sweep.

These features enable a very accurate measurement of the I-V curve, and provide a safe, substantially compact, reliable, and economical curve tracer.

The curve tracer of the invention can be modified to measure the I-V curve in any quadrant of the I-V plane. The invention can also be used in the measurement of I-V curves for energy dissipating devices as well as for devices with more than one terminal pair.

The foregoing and other objects, features and advantages of the invention will become apparent upon reference to the following detailed description and accompanying drawing. The invention is pointed out with particularity in the appended claims.

DESCRIPTION OF ILLUSTRATIVE EMBODIMENTS OF THE INVENTION

Figure 1:
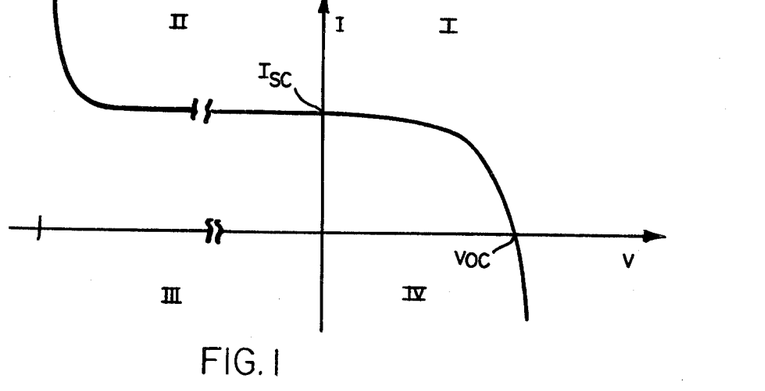
FIG. 1 illustrates an I-V curve of a typical electrical device.

As mentioned earlier, the relationship between the current and voltage of an electrical device under various load conditions characterizes the operation of the device. FIG. 1 shows this relationship for a typical electrical device under test. For illustrative purposes, the device under test to be discussed herein is an array of photovoltaic cells that generates electrical power. The invention, however, can be used to measure any type of electrical device. Furthermore, the term "sweep" as used in the description signifies the transient conditions of voltage and current at the terminals of the device beginning at the instant that a load is electrically connected across the terminals of the device and ending when the current and voltage flow reach a steady-state condition. The value of the impedance of the load itself is constant during sweeping.

Figure 2:
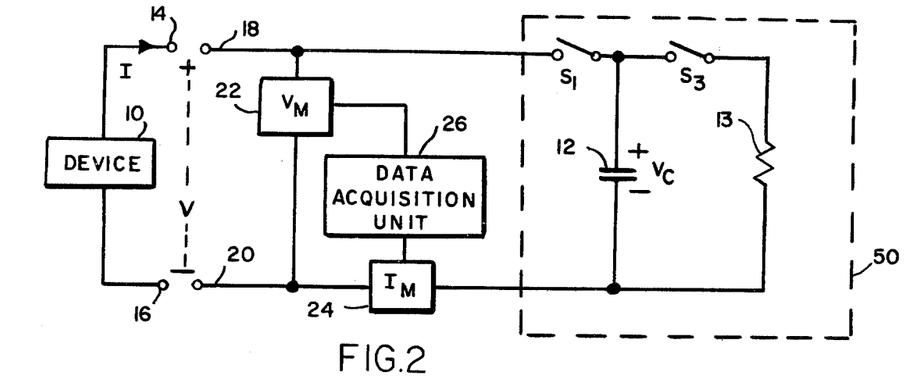
FIG. 2 is a generalized block diagram of a circuit arrangement illustrating the use of a capacitive load in the measurement of an I-V curve of an electrical device.

FIG. 2 illustrates, in a generalized block diagrammatic form, one version of the inventive curve tracer. The tracer of FIG. 2 employs as a load a capacitor 12 which, in use, is coupled across the terminals 14 and 16 of a device 10 under test through corresponding conductors 18 and 20. Switch $S_1$, when closed, starts the flow of current through the capacitor 12. The switch $S_1$ could be a manually operated switch, a silicon controlled rectifier, or similar device capable of turning on at high current and turning off at low current. The curve tracer also includes a voltage sensor 22 coupled across the output terminals 14 and 16 of device 10 to measure its voltage, and a current sensor 24 located in the current path of the device 10 thereby to measure the current flowing through the device 10. The outputs of the sensors 22 and 24 are supplied to a data acquisition unit 26, which samples the voltage and current, respectively, through these sensors. In accordance with this invention, the data acquisition unit 26 samples the voltage and current parametrically, that is, at controlled instances of time determined by incremental changes in the magnitude of a parameter of the device 10, such as voltage, current, power, or some other function of voltage and/or current. Sampling at equal voltage increments is preferred. By virtue of this sampling technique, sampling automatically begins with the closing of switch $S_1$. Furthermore, the data acquisition unit 26 captures the samples during the transient period during which capacitive load 12 is being charged by device 10. This assures that the voltage and current measurements at the output terminals of the device 10 coincide with the occurence and rate of natural sweeping so as to produce a sufficient number and even distribution of sample points along the I-V curve being measured. A more detailed illustration of the data acquisition unit 26 and associated components is contained in FIG. 3 of the drawing.

Figure 3:
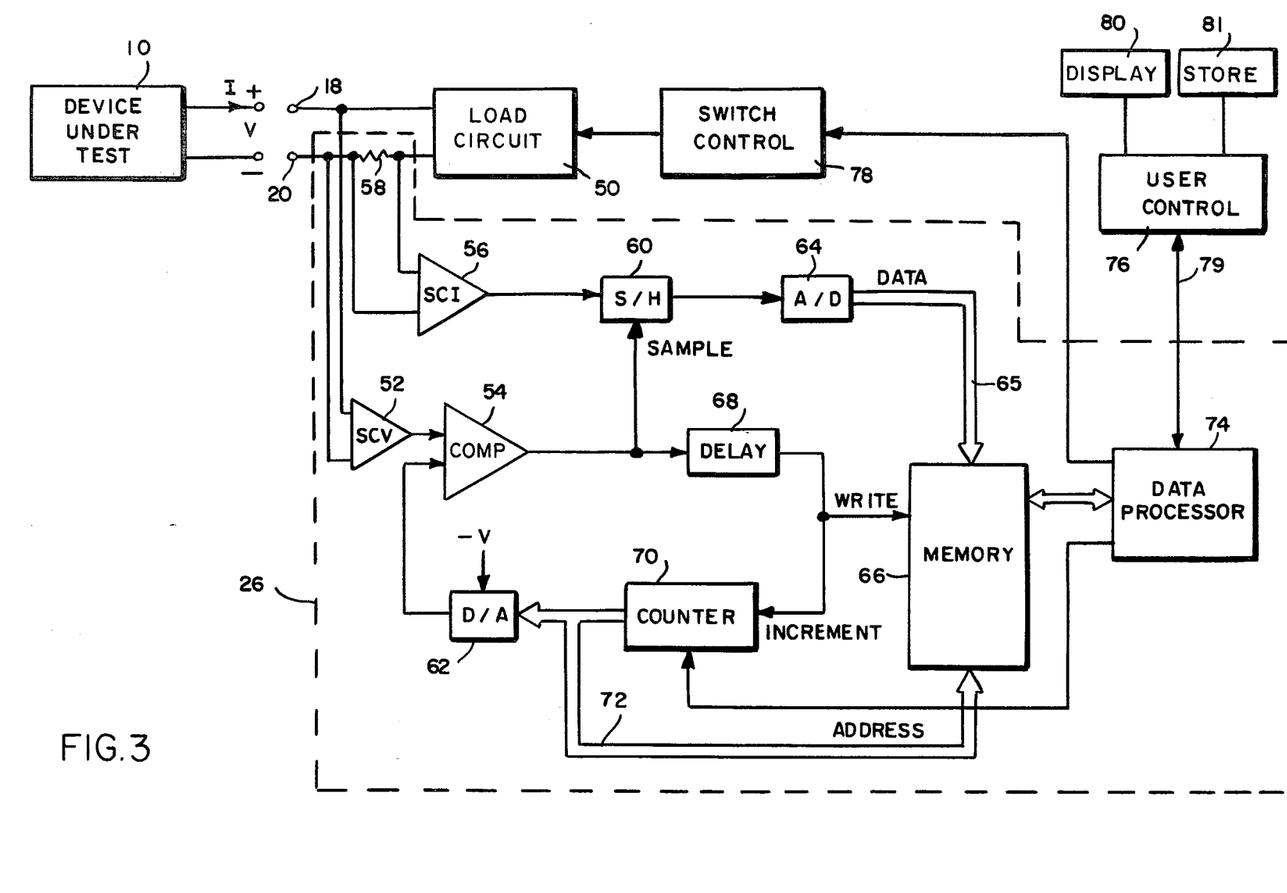
FIG. 3 is a detailed block diagram of an I-V curve tracer embodied according to the present invention showing further detail of a data acquistion unit 26 of FIG. 2 as well as associated control components.

Specifically, FIG. 3 shows the details of the data acquisition unit 26 of FIG. 2 and lumps together the capacitive load 12, energy sink 13, switches $S_1$ and $S_3$ of FIG. 2 into a single circuit block labeled 50 in FIG. 3. Overall control of the I-V curve measuring, storing, and display process is exercised by a user control unit 76. A user of the curve tracer controls it through a keyboard which is part of user control unit 76. Detailed control (such as opening and closing of switches $S_1$ and $S_3$ through a switch control circuit 78) is exercised by a data processor 74 in the data acquisition unit 26. In the preferred embodiment, the user control unit 76 comprises an HP-85 processing system manufactured by Hewlett Packard Company. The data signals for control, storage, and/or display are transferred over data link 79 to the data processor 74, which link 79, in the preferred embodiment, is an IEEE 488 bus or an RS-232 data link. The data processor 74 includes a microprocessor. The implementation of these components to effect control over the operation of the data acquisition unit 26 of FIG. 3 is not crucial to the invention, and will be readily apparent to those skilled in the art upon a review of the description to follow.

As noted, sampling is preferably performed by the data acquisition unit 26 of FIG. 3 on the voltage parameter. In operation, a signal conditioning circuit 52 senses the level of the voltage appearing across the terminals of the device 10 and supplies it to a comparator 54. Likewise, a signal conditioning circuit 56 senses the level of the current flowing through a resistor 58 that is connected in series in the electrical current path of the device 10. The current through the resistor 58 produces a voltage thereacross that is proportional to the current. The signal conditioning circuit 56 then supplies an indication of this current level to a sample/hold circuit 60.

After initiating the sweep by closing the switch $S_1$ of FIG. 2, a digital-to-analog (D/A) converter 62 (FIG. 3) supplies a representation of a first incremental voltage level to the comparator 54. When the voltage level from the circuit 52 reaches the first incremental voltage level, the output of the comparator 54 changes state which activates the sample/hold circuit 60 thereby to sample and hold the current measurement that is sensed by the circuit 56. The current measurement in the sample/hold circuit 60 is then digitized by an analog-to-digital (A/D) converter 64. The digitized value is placed on a data line 65 of a memory 66. A delay 68 delays the edge generated by the comparator 54 so that, after the digitized current measurement reaches the memory 66, the edge from delay 68 clocks the current measurement data into the memory 66 at the address provided through address select lines 72 by counter 70. The address provided by counter 70 represents the digitized voltage level which corresponds to the current measurement to be stored at that address. The edge from delay 68 also increments the counter 70 to a representation of a next voltage level, which is provided to the D/A converter 62. The delay 68 allows sufficient time for the digitized current measurement data to reach the memory 66 prior to clocking the current measurement data into the memory 66.

Meanwhile, the sweep resulting from current through the circuit 50 (which contains the load 12) continues, so that when the voltage appearing across its terminals reaches the next incremental voltage level defined by the contents of the counter 70, the comparator 54 produces another edge and thus effects repetition of the sampling and storing of current measurement data in the memory 66 by the process just explained. In effect, the sweep automatically continues until the current reaches zero and the device 10 and load 12 have reached a steady-state condition. During the sweep, the data acquisition unit 26 continues to sample at equal voltage increments that are defined by the contents of the counter 70.

After the sampling process terminates, the data processor 74 retrieves the data stored in the memory 66 and transfers the data to the user control unit 76. The user control unit 76 in turn processes and couples the data to display an I-V curve of the type depicted in FIG. 1 on a display device 80, such as a CRT display or x-y plotter. The user control unit 76 may also store the retrieved data in a storage device 81, such as a magnetic tape or disk device. After the memory data is transferred, switch $S_3$ is closed and the charge stored in the capacitor is dissipated by energy sink 13 (switch $S_3$ and energy sink 13 being included in the circuit 50 of FIG. 3).

When the curve tracer of FIGS. 2 and 3 is used to measure, for example, a 10 KW photovoltaic array, capacitor 12 should have about 2000 microfarads of capacitance which provides a sweep time of about twenty milliseconds. With photovoltaic arrays, when the sweep speed is too fast, parasitic effects such as line inductance and cell junction capacitance begin to interfere with and distort the I-V curve. However, fast sweep rates reduce the average power level. Thus one needs to work as close as possible to the fast sweep rate limit at which parasitic effects become significant.

For photovoltaic arrays, the relationship among circuit parameters and time may be expressed approximately as follows:

$$V_{oc} = \frac{I_{sc}}{C} \cdot T_{sweep} \text{ and } C = \frac{I_{sc}}{V_{oc}} \cdot T_{sweep}$$

where $V_{oc}$ is the open-circuit voltage of the array, $I_{sc}$ is the short-circuit current of the array, $T_{sweep}$ is the approximate time of sweep, and C is the value of the capacitance. This relationship shows that, for a predetermined sweep time, the value of the capacitance C to be used in the curve tracer is a function of ratio $I_{sc}/V_{oc}$. Thus, if we chose, for example, a minimum sweep time of two milliseconds, a 2000 microfarad capacitor 12 would handle any array where $I_{sc}/V_{oc}$ is less than unity. This relationship can thus be used in establishing the size of the capacitor 12 to be used in the curve tracer of FIG. 2.

Figure 4A:
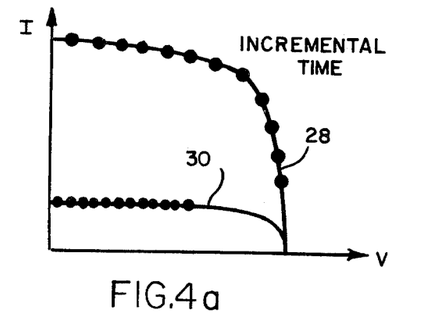
FIG. 4a shows the distribution of sampling points on an I-V curve when taken at equal increments of time during sweeping.

To illustrate one advantage of the parametric sampling technique used in the arrangement shown in FIGS. 2 and 3 over prior art sampling techniques, we show in FIG. 4a the locations of samples taken at equal time increments on typical I-V curves in the first quadrant of the I-V plane (i.e., quadrant I of FIG. 1). As seen in FIG. 4a, the sample points on curve 28 are distributed so that when connected, the curve 28 could be formed, The curve represented thereby was derived by sweeping a photovoltaic array of a certain operating voltage with a fixed amount of capacitance. If, for instance, the same fixed amount of capacitance was used to sweep a photovoltaic array of a lower operating current, such as that represented by curve 30 in FIG. 4a, the charging rate would be slower and the sample points would be compressed and distributed only on a portion of the beginning of the sweep of the I-V curve as represented by the marks on curve 30. Thus, in order to establish a complete representation of the curve 30, it would be necessary to extend the time of the sampling period, increase the spacing of the time increment at which the samples are taken, or change the value of the capacitance. The latter action effectively increases the duration of the sampling period in order to measure the entire sweep.

To make this adjustment, some prior art curve tracers, like the NASA/Lewis curve tracer previously mentioned, require that the user manually select the value of capacitance to be used thereby to establish the duration of the sweep time. Although one may be required when utilizing the present invention to make an initial coarse range setting in the data acquisition unit 26, adjustments of the capacitor 12 are not necessary. The NASA/Lewis curve tracer, however, requires fine adjustment of the value of the load capacitance in order to obtain useful measurements. If it is desired to measure wide ranges of power, this could be a rather cumbersome operation requiring a substantial amount of time for setting up and performing the I-V curve measurement if $V_{oc}$ and $I_{sc}$ are not precisely known. This fine adjustment can be a particularly troublesome in situations of varying illumination, such as on cloudy days.

Figure 4B:
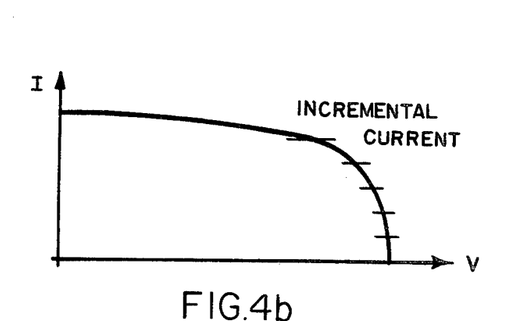
FIG. 4b shows the distribution of sampling points on an I-V curve when taken at equal increments of current change during sweeping.
Figure 4C:
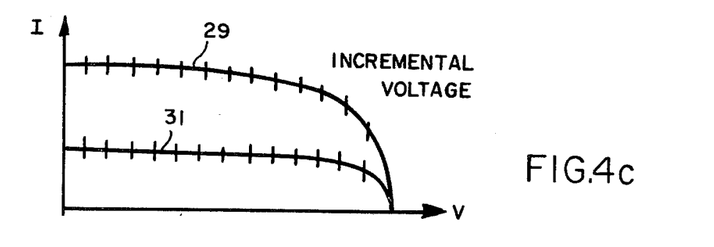
FIG. 4c shows the distribution of sample points on an I-V curve when taken at equal increments of voltage change during sweeping.

FIG. 4b shows the sampling locations on an I-V curve when sampling is performed at equal current increments, while FIG. 4c shows the sampling locations on an I-V curve when sampling is performed at equal voltage increments. As can be seen by comparing FIGS. 4b and 4c, sampling on equal voltage increments produces a more uniform sampling of the I-V curve over its entire extent. Thus, in the preferred embodiment shown in FIG. 3, the data acquisition unit 26 samples the current and voltage at equal increments of voltage as depicted in FIG. 4c. Prior to taking the measurement of the photovoltaic array, the operator need only adjust the voltage and current scales of the curve tracer to be equal to or greater than the open-circuit voltage and short-circuit current, respectively, of the device 10. These voltage and current values are easily measured after connecting the tracer to the device 10 and prior to closing switch $S_1$. The prescaling may be readily performed with the signal conditioning circuits 52 and 56 prior to beginning the sweep. The data acquisition unit 26 of FIG. 3 thus obviates to a significant extent the necessity to manually set the level of capacitance, durations of the sweep period, and sampling intervals.

FIG. 4c also shows I-V curves at two operating currents, one at a higher current 29 and one at a lower current 31. A comparison of the variation in distribution of sample points from one operating current 29 to another 31 in FIG. 4a (sampling on time increments) with the variation in distribution of sample points from one operating current 29 to another 31 in FIG. 4c (sampling on voltage increments) illustrates another benefit of parametric sampling, namely, the distribution of sampling points does not change significantly with changes in operating current when parametric sampling is employed.

It should be noted that the incremental changes in the parameter that triggers the sampling by the data acquisition unit 26 of FIG. 3 need not be of equal value. For example, the rate of taking of measurements can be varied according to the location on the I-V curve by varying the size of the increments depending on the location on the I-V curve. Of specific importance is the segment of the I-V curve about the maximum power point. In this segment, samples might be taken at smaller increments of the sample triggering parameter.

The data acquisition unit 26 of FIG. 3 can be readily modified so that, rather than sampling the current at equal voltage increments, the D/A converter 62 could be coupled to a circuit that measures power, and the signal conditioning circuit 52 could likewise be configured to produce indications of power so that, upon incremental changes in the power, the current would be sampled. Power, unlike voltage and current, does not increase monotonically during a typical sweep. Rather power increases, peaks, and diminishes. With two modifications, the circuit of FIG. 3 can accomodate parametric sampling where the trigger parameter is not monotonic during a sweep. This modification would involve the use of separate counters for the parameter trigger value and for the memory address in place of the single counter 70, and the use of a window comparator (or two comparators) with two thresholds in place of the comparator 54. The window comparator would be connected to the parameter trigger value counter such that exceeding the upper threshold increments the counter, and going below the lower threshold decrements the counter. The window comparator would then be connected to the memory address counter so that either of these two events increments the memory address counter.

Other modifications, as well, to the data acquisition unit 26 shown in FIGS. 2 and 3 will now be apparent to those skilled in the art, for example, to cause it to sample upon incremental changes of any function of voltage and current. Also, instead of using a memory for storing the sampled voltage and current, the data could be stored and displayed simultaneously on a CRT storage oscilloscope.

Figure 5:
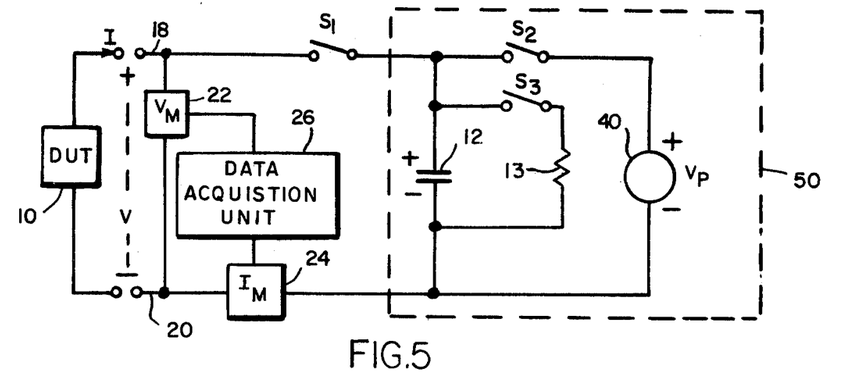
FIG. 5 is a block diagram of a modification of the circuit arrangement of FIG. 2, which modification provides for precharging a bipolar capacitor to a certain voltage, positive or negative, before the sweep.

A variation of the invention is shown in FIG. 5, in which the capacitor 12 may be bipolar or unipolar. If the capacitor 12 is bipolar, then a voltage source 40 may be used to precharge it to a positive or negative voltage. While the switch $S_1$ is open to decouple the terminals of the capacitor 12 from the device 10, a switch $S_2$ is momentarily closed to allow the capacitor 12 to precharge to the voltage level of the source 40. After the capacitor 12 reaches the predetermined precharge voltage $V_p$, the switch $S_2$ is opened and switch $S_1$ is closed. Upon closing switch $S_1$, the charging of the capacitor 12, the sampling of current and voltage by the data acquisition unit 26, and the discharge of the capacitor 12 through switch $S_3$ and energy sink 13 take place as previously explained in connection with FIGS. 2 and 3.

If a unipolar capacitor 12 is used, as the case might be when large capacitors are required to measure high power arrays, then only a single polarity precharge voltage could be used.

Figure 6:
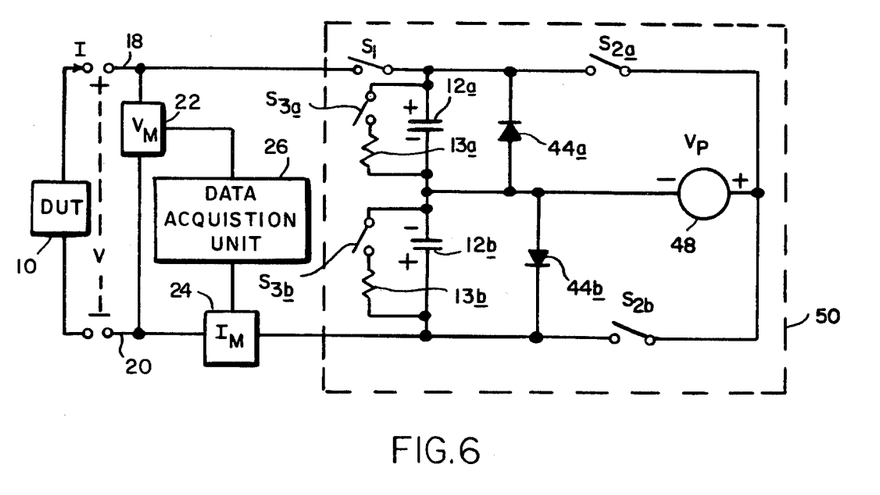
FIG. 6 is a block diagram of a further modification of the circuit arrangement of FIG. 2, which modification permits negative precharging using a unipolar capacitor before the sweep.

FIG. 6 shows a variation of the circuit of FIG. 2 which can be used to begin the sweep from either a negative voltage level (quadrants marked in FIG. 1 as II and III) or a positive voltage level (quadrants IV and I). This circuit uses two unipolar capacitors 12a and 12b which are connected back-to-back. By closing respectively either switch $S_{2a}$ or switch $S_{2b}$ a voltage source 48 precharges either capacitor 12a or capacitor 12b. Thus, closing switch $S_{2a}$ causes the sweep to begin at a positive voltage level. A diode 44a coupled across capacitor 12a prevents the buildup of reverse voltage on the capacitor 12a and holds its positive charge so that sweeping is initiated from a positive voltage. Closing switch $S_{2b}$, on the other hand, causes the sweep to begin at a negative voltage level. Diode 44b prevents reverse voltage buildup on capacitor 12b and holds a negative charge thereon so that sweeping begins from a negative voltage level. In either case, after a precharge has been placed on the capacitor 12a or 12b by closing either switch $S_{2a}$ or $S_{2b}$, the corresponding switch $S_{2a}$ or $S_{2b}$ is opened and the switch $S_1$ is closed thereby to initiate sweeping in the manner previously described. The data acquisition unit 26 then parametrically samples the voltage and current appearing at the sensors 22 and 24 as described above in connection with FIGS. 2 and 3. At the end of data acquisition, either switch $S_{3a}$ and energy sink 13a or switch $S_{3b}$ and energy sink 13b would be used to discharge either capacitor 12a or 12b as needed.

Figure 7:
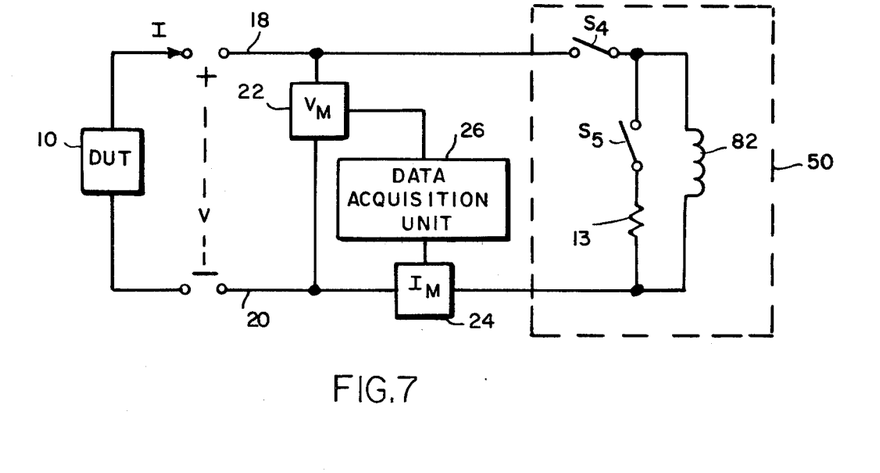
FIG. 7 is a block diagram of a circuit arrangement using an inductive load with the present invention.

FIG. 7 shows a circuit arrangement for sweeping an inductor 82, instead of a capacitor across the device 10. The same data sampling technique described in connection with FIGS. 2 and 3 can be used in the arrangement of FIG. 7, except that the counter 70 would be decremented from an initial higher voltage representation since the inductor 82 will sweep from a high voltage/zero current to a low voltage/high current. To turn off the current at the end of the sweep, a switch $S_5$ is closed simultaneously with the opening of the a switch $S_4$ and energy is dissipated in energy sink 13. In order to trace the I-V curve in quadrant II, an initial current flow can be forced through the inductor 82 prior to beginning the sweep, as will be described below in relation to FIG. 11.

Thus, it can be seen from the above that by choosing an inductor or capacitor and using an initial current or voltage, respectively, traces of an I-V curve can be made in any quadrant of the I-V plane.

The device 10 in the foregoing embodiments was assumed to be a photovoltaic array, which as noted is an energy generating device. When the device 10 whose I-V curve is to be measured is an energy dissipating device, only slight modifications to the above-described versions of the tracer of the invention are needed. For example, assume it is desired to measure the I-V curve of a bipolar transistor, which is an energy dissipating device. Such an application also raises the issue of how to measure devices with more than one terminal pair. Generally, this is accomplished by sweeping only one terminal pair, either in voltage or in current, while currents or voltages at the remaining terminal pairs are held constant. A transistor has two terminal pairs: a base-emitter pair and a collector-emitter pair. An example of sweeping each of these terminal pairs will be given. Further, the examples will be chosen to depict both current and voltage sweeping.

Figure 8:
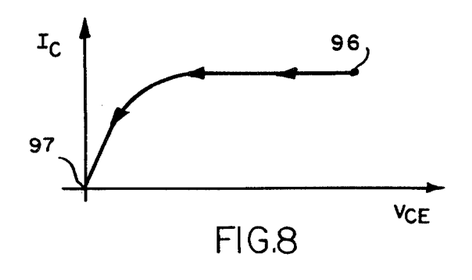
FIG. 8 is a plot of collector current versus collector-emitter voltage, one type of I-V curve for a transistor that may be obtained using the present invention.
Figure 9:
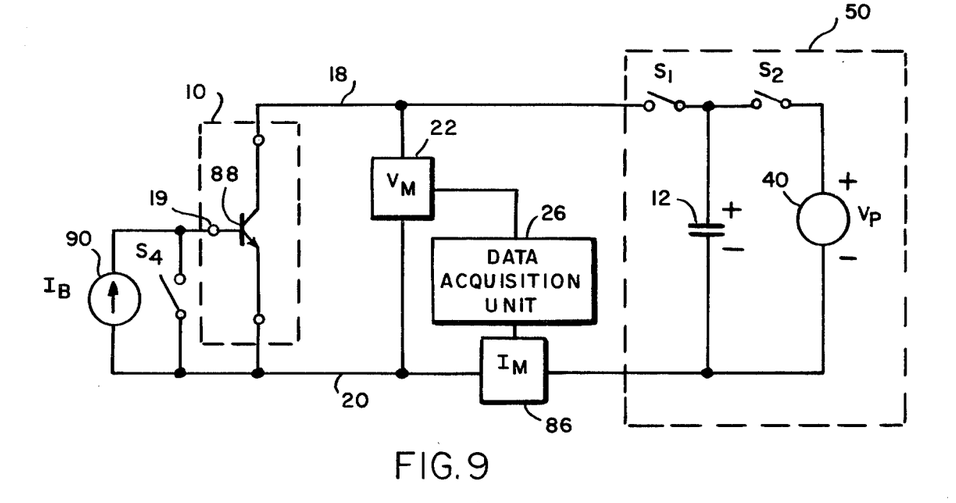
FIG. 9 is a diagram of a circuit arrangement for measuring the curve shown in FIG. 8.

To begin, assume that the base-emitter terminal pair current is held constant while the collector-emitter voltage is swept. The standard I-V curve in such a case plots collector current, $I_C$, versus collector-emitter voltage, $V_{CE}$, with base current, $I_B$, held constant. One such curve is shown in FIG. 8. A diagram of a curve tracer for making this measurement is shown in FIG. 9. To make this measurement, the collector, emitter, and base terminals of a transistor 88 to be tested are connected to the terminals 18, 20, and 19, respectively, of the tracer of FIG. 9. With switch $S_1$ open and switch $S_4$ closed, switch $S_2$ is closed and an initial charge is placed on capacitor 12 by voltage source 40. When the voltage across capacitor 12 reaches the maximum value of $V_{CE}$ necessary for the test, $S_2$ is opened, followed by closing of $S_1$. This places an initial voltage across the collector-emitter terminals of the transistor 88; but with no base current, the collector current is zero. Opening $S_4$ begins the test by injecting base current from current source 90, thereby moving the transistor rapidly to point 96 in FIG. 8. The injected base current will cause a resultant collector current to flow. The flow of collector current will begin to discharge capacitor 12, consequently reducing the voltage across it. Accordingly, this lowers the $V_{CE}$ applied to the transistor 88. Thus, the I-V curve is traced out in the direction indicated by the arrows of FIG. 8. Upon complete discharge of capacitor 12, $I_C$ and $V_{CE}$ will be zero; this is represented by point 97 in FIG. 8. Switch $S_1$ is then opened and switch $S_4$ closed to end the sweep. If the I-V curve for another value of base current is desired, the value of current source 90 is set accordingly and the process repeated, starting with the precharging of capacitor 12.

Figure 10:
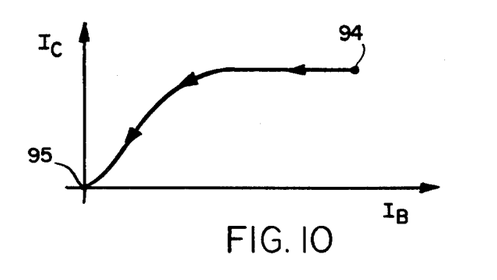
FIG. 10 shows a plot of collector current versus base current, another type of I-V curve for a transistor that may be obtained using the present invention.

The above characterization of a transistor is particularly well suited for linear region applications such as amplification. For switching applications a plot of $I_C$ versus $I_B$ with $V_{CE}$ as the constant parameter has recently been introduced. An example of this type of plot is shown in FIG. 10. Measuring an I-V curve of this type ($I_C$ versus $I_B$) will also demonstrate a case where current is swept; specifically where base current is swept while the collector voltage is held constant. A circuit for measuring such an I-V curve is shown in FIG. 11.

Figure 11:
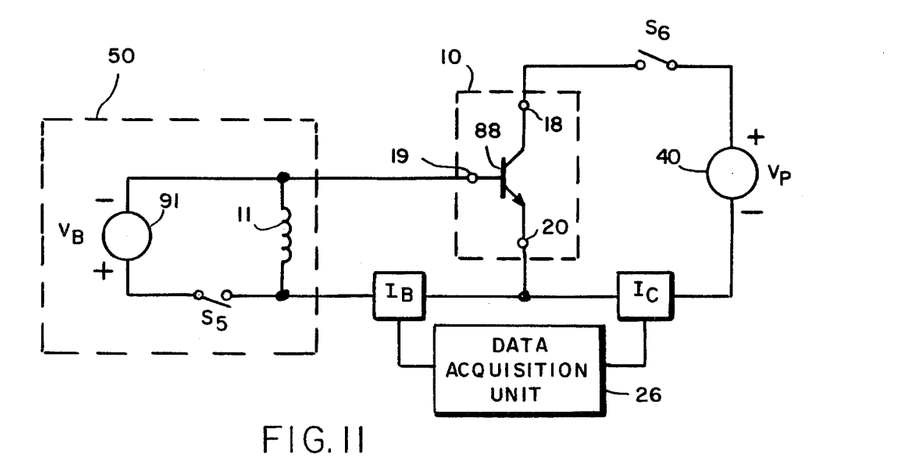
FIG. 11 is a diagram of a circuit arrangement for measuring the curve shown in FIG. 10.

Initially in FIG. 11, switches $S_5$ and $S_6$ are open. Once the transistor 88 has been connected, $S_6$ is closed, thereby applying the chosen value of voltage across the collector-emitter junction, $V_{CE}$. Switch $S_5$ is then closed causing the current to build up in an inductor 11. If the voltage source 91 produces a constant voltage, then the current in the inductor 11 will build linearly with time. When the value of current through the inductor 11 reaches the maximum value of $I_B$ required for the test, switch $S_5$ is opened. This is represented by point 94 in FIG. 10. The current flowing through the inductor 11 will then flow through the base-emitter junction, thereby causing the collector current $I_C$ to flow. As the inductor current, which is also the base current $I_B$, decreases, so will $I_C$; thus the desired I-V curve is swept. The direction of the sweep is indicated by the arrows in FIG. 10. When the currents $I_B$ and $I_C$ reach zero, switch $S_6$ is opened to end the sweep. This point is represented by point 95 in FIG. 10. If a plot for another value of $V_{CE}$ is desired, voltage source $V_P$ is adjusted and the test procedure is repeated.

In the embodiment of FIG. 11, some care must be used in choosing the magnitude of $V_B$. It must not exceed the reverse breakdown capabilities of the transistor 88 or other device under test. Normally, for a silicon transistor, this is around 6 to 8 volts. Should higher values of current be required, a flyback transformer could be used instead of the inductor 11 in FIG. 11.

Accordingly, it is the intent of the inventors to include within the scope of the invention those modifications, changes and alterations to any aspect of the invention which may be envisioned by one skilled in the art and which fall within the true scope of the invention as defined by the appended claims.

We claim:
1. An I-V curve tracer for measuring an I-V relationship of an electrical device, said tracer comprising:
   A. a first sensor for measuring a first parameter of the electrical device,

B. a second sensor for measuring a second parameter of the electrical device,

C. sweep means for varying the first and second parameters of the electrical device, D. means for determining a third parameter of the electrical device, and E. data acquisition means for taking samples of the first and second parameters at a sequence of times, said data acquisition means being coupled to said first sensor and said second sensor and to said means for determining the third parameter, said data acquisition means being operative in response to the third parameter of the electrical device so as to determine the times at which the samples are taken.

2. The I-V curve tracer of claim 1 in which the third parameter is the voltage across the electrical device and in which said data acquisition means samples the first parameter and the second parameter in response to predetermined incremental changes in the voltage across the electrical device.

3. The I-V curve tracer of claim 1 in which the third parameter is the current through the electrical device and in which said data acquisition means samples the first parameter and the second parameter in response to predetermined incremental changes in the current through the electrical device.

4. The I-V curve tracer of claim 1 in which the third parameter is a function of the voltage across and the current through the electrical device and in which said data acquisition means samples the first parameter and the second parameter in response to predetermined incremental changes in the function of the current through and voltage across the electrical device.

5. The I-V curve tracer of claim 1 in which the first parameter measured by said first sensor is the voltage across the electrical device.

6. The I-V curve tracer of claim 1 in which the second parameter measured by said second sensor is the current through the electrical device.

7. The I-V curve tracer of claim 2 in which the first parameter measured by said first sensor is the voltage across the electrical device.

8. The I-V curve tracer of claim 1 in which said data acquisition means includes
means for storing values corresponding to the first parameter and second parameter sampled by said data acquisition means.

9. The I-V curve tracer of claim 8 in which said storing means comprises memory means including a plurality of addressable memory locations, and in which said data acquisition means includes
means for generating digital representations of the first parameter and the second parameter sampled by said data acquisition means and for storing said digital representations in the addressable locations of said memory means.

10. The I-V curve tracer of claim 8 in which the first parameter and third parameter are the same parameter of the electrical device, in which said storing means comprises memory means including a plurality of memory locations, each of the memory locations being adapted to store data and being identified by an address, and in which said data acquisition means further includes
means for generating a digital representation of the third parameter of the electrical device and for associating the digital representation of the third parameter with the address of one of the memory locations of said memory means, and
means for generating a digital representation of the second parameter of the electrical device and for storing the digital representation of the second parameter as the data at the address of said one of the memory locations of said memory means associated with the digital representation of the third parameter.

11. The I-V curve tracer of claim 10 in which the first and third parameter of the electrical device are the voltage across the electrical device, and in which the second parameter is the current through the electrical device.

12. The I-V curve tracer of claim 8 further including
means for retrieving from said storing means the values corresponding to the first and second parameters sampled by said data acquisition means, and
means for displaying said values.

13. The I-V curve tracer of claim 1 in which said sweep means includes
a load and
switch means for connecting said load to the electrical device.

14. The I-V curve tracer of claim 13 further including energy sink means for dissipating energy stored in said load after completion of the sampling by said data acquisition means.

15. The I-V curve tracer of claim 13 in which said load comprises
a reactive load.

16. The I-V curve tracer of claim 15 in which said reactive load comprises a capacitor.

17. The I-V curve tracer of claim 16 further including a voltage source for precharging said capacitor prior to the time said switch means connects said capacitor to the electrical device.

18. The I-V curve tracer of claim 16 in which said reactive load comprises a pair of unipolar capacitors connected back-to-back, and in which said tracer further includes
a voltage source for precharging each of said capacitors prior to the time said switch means connects said capacitors to the electrical device.

19. The I-V curve tracer of claim 16 in which the first parameter is the voltage across the electrical device and the second parameter is the current through the electrical device and in which the value C of said capacitor is determined generally by the relationship:

$$C = \frac{I_{sc}}{V_{oc}} \cdot T_{sweep}$$

where $I_{sc}$ is the short-circuit current of the electrical device, $V_{oc}$ is the open-circuit voltage of the electrical device, and $T_{sweep}$ is a desire sweep time during which the voltage and current of the electrical device are sampled after said switch means connects said capacitor to the electrical device.

20. The I-V curve tracer of claim 15 in which said reactive load comprises an inductor.

21. The I-V curve tracer of claim 20 further including a current source for placing an initial current through said inductor prior to the time said switch means connects said inductor to the electrical device.

22. The I-V curve tracer of claim 1 in which said means for determining the third parameter comprises a third sensor.

23. The I-V curve tracer of claim 1 in which said means for determining the third parameter determines the third parameter from a function of at least one of the first and second parameters.

* * * * *